United States Patent [19]

Cunningham et al.

[11] Patent Number: 5,468,689
[45] Date of Patent: Nov. 21, 1995

[54] METHOD FOR PREPARATION OF SILICON NITRIDE GALLIUM DIFFUSION BARRIER FOR USE IN MOLECULAR BEAM EPITAXIAL GROWTH OF GALLIUM ARSENIDE

[75] Inventors: John E. Cunningham, Lincroft; Keith W. Goossen, Aberdeen; William Y. Jan, Scotch Plains; James A. Walker, Howell, all of N.J.

[73] Assignee: AT&T Corp., Murray Hill, N.J.

[21] Appl. No.: 153,719

[22] Filed: Nov. 16, 1993

[51] Int. Cl.$^6$ .............................. H01L 21/02; H01L 21/20
[52] U.S. Cl. .......................... 437/241; 385/129; 385/130; 385/131; 385/132; 385/14
[58] Field of Search .............................. 437/241; 385/14, 385/129, 130, 131, 132

[56] References Cited

U.S. PATENT DOCUMENTS

| | | | |
|---|---|---|---|
| 4,210,470 | 7/1980 | Marinace | 148/33.2 |
| 4,262,631 | 4/1981 | Kubacki | 118/723 |
| 4,532,695 | 8/1985 | Schuermeyer | 29/571 |
| 4,546,540 | 10/1985 | Ueyanagi et al. | 29/579 |
| 4,645,683 | 2/1987 | Gourrier et al. | 427/38 |
| 4,836,885 | 7/1989 | Breiten et al. | 156/643 |
| 5,045,346 | 9/1991 | Tabasky et al. | 427/39 |
| 5,075,743 | 12/1991 | Behfar-Rad | 357/17 |
| 5,094,984 | 3/1992 | Liv et al. | 437/235 |
| 5,238,869 | 8/1993 | Shichijo et al. | 437/126 |
| 5,360,754 | 11/1994 | Pribat et al. | 437/89 |

OTHER PUBLICATIONS

"GaAs Multiple Quantum Well . . . on Si Substrates", Treyz G. V. Appl Phys Lett, 57 (11) Sep. 10, 1990.
Wolf, S. "Silicon Proc. For the Phs VLSI ERA", Lattice Press, 1986.
D. L. Smith et al.; "Mechanism of $SiN_xH_y$ Deposition From $N_2$–$SiH_4$ Plasma" Journal of Vacuum Science Technology, B 8 (3), May/Jun. 1990, p. 552 et seq.

*Primary Examiner*—R. Bruce Breneman
*Assistant Examiner*—Matthew Whipple

[57] ABSTRACT

A technique is described for the preparation of a thin film of a silicon nitride diffusion barrier to gallium on a silicon integrated circuit chip. The technique involves reacting nitrogen and silane in a ratio of 53:1 to 300:1 in a plasma enhanced chemical vapor deposition apparatus. The described technique is of interest for use in the monolithic integration of interconnected GaAs/AlGaAs double heterostructures, modulators and silicon MOSFET structures.

7 Claims, 1 Drawing Sheet

METHOD FOR PREPARATION OF SILICON NITRIDE GALLIUM DIFFUSION BARRIER FOR USE IN MOLECULAR BEAM EPITAXIAL GROWTH OF GALLIUM ARSENIDE

FIELD OF THE INVENTION

This invention relates to the use of silicon nitride as a gallium diffusion barrier during molecular beam epitaxial growth of gallium arsenide compounds on silicon submicron metal oxide semiconductor (MOS) electronics. More particularly, the present invention relates to a technique for the deposition of silicon nitride films by plasma enhanced chemical vapor deposition (PECVD) in which the composition of the gas employed during the deposition process is controlled within a specific range.

BACKGROUND OF THE INVENTION

The use of optical interconnects for silicon integrated circuits has been employed heretofore to take advantage of the greater capacity of optoelectronics for communications while retaining the computational advantages of silicon electronics. The integration of optoelectronic devices directly on silicon circuits offers the added advantage that such devices need not be located along the chip edge, thereby enhancing the potential for increasing the "pinout counts" of the chip. Accordingly, those skilled in the art have focused their interest upon the molecular beam epitaxial growth of gallium arsenide/aluminum gallium arsenide (GaAs/AlGaAs) multiple quantum well modulators on submicron MOS electronics.

During the growth of gallium arsenide on MOS devices by heteroepitaxy, it is necessary to protect the silicon device from the affect of gallium which readily diffuses into the silicon, so resulting in the formation of a conductive oxide. In order to obviate this limitation, the use of a silicon nitride layer over the oxide has been found to result in a diffusion barrier during molecular beam epitaxial growth. However, in order to assure success of the nitride barrier it is essential that the barrier evidence sufficient resistance to hydrofluoric acid used to clean the silicon surfaces prior to growth. Furthermore, the nitride barrier must evidence sufficient mechanical stability to withstand oxide desorption at temperatures in excess of 900 degrees Centigrade which are necessary for the successful growth of gallium arsenide on silicon without effecting cracking or loss of adhesion. The mechanical stability is especially critical for submicron MOS electronics which have as their top dielectric layer a glass which liquefies at 850 degrees Centigrade to round the edges of contact holes. It is this liquification of the reflow glass which tends to cause failure of the nitride diffusion barrier.

SUMMARY OF THE INVENTION

In accordance with the present invention, the limitations of the prior art methodology are effectively obviated by carefully controlling the processing conditions during plasma enhanced chemical vapor deposition (PECVD) of silicon nitride. More specifically, it has been found that silicon nitride films deposited by plasma enhanced chemical vapor deposition (PECVD) in the absence of ammonia exhibit lower residual stress levels during molecular beam epitaxial growth. Studies have revealed that if the nitrogen to silane ratio during the silicon nitride growth is kept below a value of 400:1 the nitride films do not exhibit stress induced cracking at molecular beam epitaxial growth processing temperatures and further evidence excellent resistance to hydrogen fluoride based etchants.

BRIEF DESCRIPTION OF THE DRAWING

The invention will be more readily understood by reference to the following detailed description taken in conjunction with the accompanying drawing wherein.

DETAILED DESCRIPTION OF THE INVENTION

Figure 1:
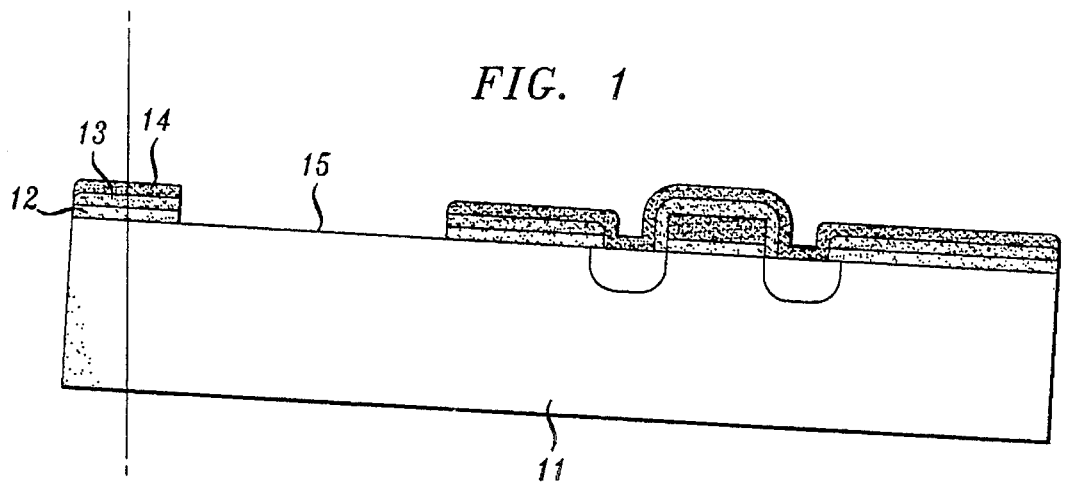
FIG. 1 is a front elevational view in cross section of a silicon MOSFET structure without metallization for an integrated gallium arsenide modulator prior to molecular beam epitaxial growth.

The MOS fabrication described is effected in (100) silicon oriented 3 degrees off axis toward the (110) face as normally required for high quality gallium arsenide growth on silicon. Circuits are produced in the silicon by standard technologies which include a reflow glass as the top dielectric layer. Before the metal interconnect lines are deposited on the silicon, the wafers are diced into chips. The chips are then prepared for simulated growth by depositing the silicon nitride diffusion barrier. Each of the chips is cleaned by conventional cleansing techniques and loaded into a chemical vapor deposition chamber. Silicon nitride is then deposited by reaction of nitrogen and silane with a nitrogen to silane gas ratio ranging from 53:1 to 400:1. Then, the chips so treated are loaded into a nitrogen ambient furnace and heated to a temperature within the range of 600 to 1000 degrees Centigrade at a rate of approximately 40 degrees Centigrade per minute and held at that temperature for approximately one (1) hour. Next, the chips so treated are cooled to room temperature and examined for evidence of cracking or adhesion loss due to the thermal cycling process. For comparative purposes, the process was repeated using nitrogen to silane ratios ranging from 400:1 to 1250:1.

The results of such testing in Table I which is set forth below. In the Table, MOS chips which evidenced cracking during thermal cycling have been noted with an asterisk in the temperature columns at the temperature at which cracking was observed for varying nitrogen to silane ratios. Etch rate, in Angstroms per minute, film thickness in Angstrom units and refractive index is also shown in the Table for each of the samples evaluated.

TABLE I

| $N_2$:Si Ratio | Film Thickness (Å) | Etch rate (Å/min.) | Refractive Index | Cracks @ 1000° | Cracks @ 800° | Cracks @ 600° |
|---|---|---|---|---|---|---|
| 53:1 | 800 | 4 | 2.753 | | | |
| 215:1 | 850 | 13 | 2.505 | | | |
| 250:1 | 813 | 15 | 2.462 | | | |
| 300:1 | 753 | 22 | 2.347 | * | * | |
| 300:1 | 847 | 24 | 2.399 | | | |
| 320:1 | 648 | 23 | 2.357 | | | |
| 350:1 | 782 | 27 | 2.315 | | | |
| 400:1 | 965 | 28 | 2.330 | * | * | |
| 430:1 | 841 | 54 | 2.232 | * | * | |
| 600:1 | 961 | 120 | 2.091 | * | | |
| 700:1 | 926 | 206 | 1.943 | * | * | |

TABLE I-continued

| N2:Si Ratio | Film Thickness (Å) | Etch rate (Å/min.) | Refractive Index | Cracks @ 1000° | Cracks @ 800° | Cracks @ 600° |
| --- | --- | --- | --- | --- | --- | --- |
| 800:1 | 795 | 227 | 1.999 | * | * | |
| 1000:1 | 860 | 860 | 1.908 | * | * | |
| 1250:1 | 902 | 1804 | 1.860 | * | * | |

It will be appreciated that films deposited with a nitrogen to silane ratio less than 300:1 did not evidence cracking. However, all films deposited at nitrogen to silane ratios greater than 400:1 evidenced cracking when cycled at temperatures greater than 800 degrees Centigrade. For comparative purposes, nitride films deposited on bare silicon substrates subjected to the same thermal cycling did not evidence cracking or lose adhesion, so indicating that melting of the underlying reflow glass induces mechanical failure in the silicon nitride films.

With reference now to FIG. 1, there is shown a cross-sectional view in front elevational view of a MOSFET structure employed in the practice of the present invention prior to molecular beam epitaxial growth. Shown in the Figure is a (100) silicon substrate 11 which is oriented 3 degrees off axis. Substrate 11 includes thereon successively a thin film of silicon dioxide 12, a reflowable glass layer 13 such as phosphosilicate glass or BPTEOS which has a lower melting point than that of standard silicon dioxide. The purpose of the reflow glass is to allow the rounding off of the top corners of the contact holes to ensure adequate step coverage during the metallization of transistors. Also shown is silicon nitride diffusion barrier 14 deposited upon glass layer 13. Areas destined for molecular beam epitaxial growth 15 which appear open are typically opened in a processing sequence involving reactive ion etching through the dielectric stack upon the substrate which includes the silicon dioxide, reflow glass and silicon nitride.

Figure 2:
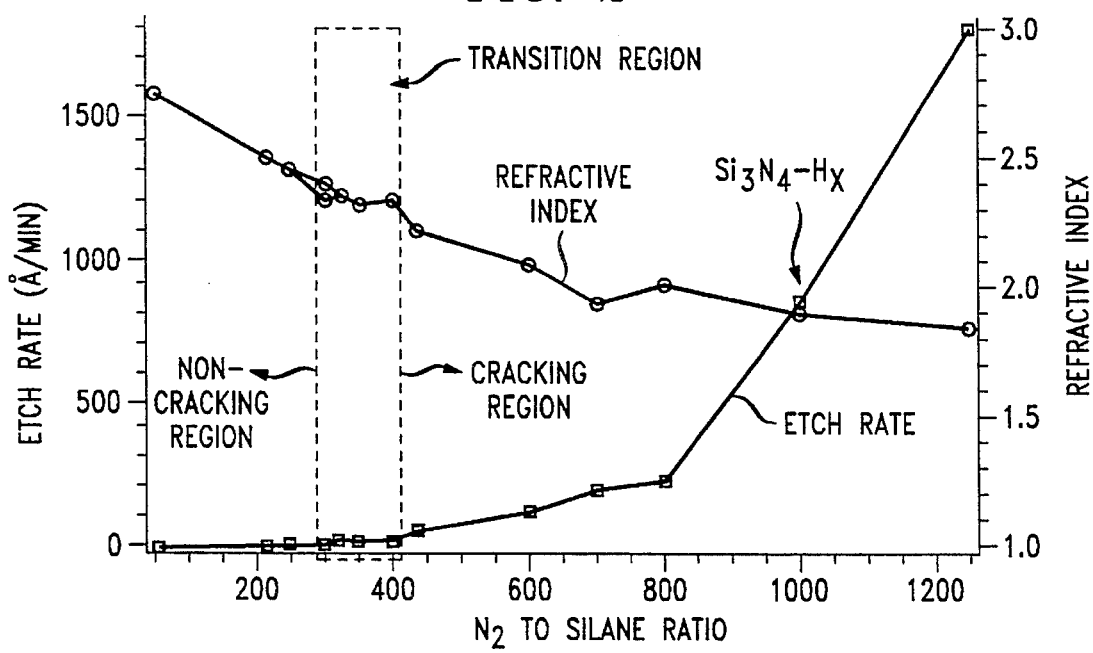
FIG. 2 is a graphical representation on coordinates of nitrogen to silane ratio against etch rate (10:1 $H_2O$:HF) in Angstroms per minute and refractive index showing the affect of process control on film stress, refractive index and etch rate.

With reference now to FIG. 2, there is shown a graphical representation on coordinates of nitrogen to silane ratio against wet etch rate (10:1 $H_2O$:HF) in Angstroms per minute and refractive index. The data plotted thereon reveals the effect of the control of growth parameters on these characteristics. It will be noted by examination of the graphical data that there is a sharp rise in etch rate with a corresponding drop in refractive index at gas ratios greater than 800:1. At gas ratios in the range of 300:1 to 400:1, there is evidence of slight instability as the refractive index tends to behave non-linearly.

An example of the application of the present invention is set forth solely for purposes of exposition and is not to be construed as limiting.

EXAMPLE

A group of CMOS circuits with 0.9 micrometer line width rules, not including a silicon nitride diffusion barrier, was separated into chips suitable for individual processing. Each chip was subjected to identical cleaning procedures involving ten (10) minute treatments with a 10:1 aqueous sulfuric peroxide solution followed by a distilled water rinse. Then, lots of three (3) chips were loaded into a single wafer parallel plate PECVD chamber together with several bare silicon samples. Each lot was then coated with silicon nitride deposited from an ambient comprising nitrogen and silane in varying gas ratios ranging from 53:1 to 1250:1 (nitrogen to silane). The reaction chamber employed was a standard glow discharge parallel plate plasma reactor. The gases were supplied through a uniform array of holes in an rf-powered counterelectrode 15 centimeters in diameter spaced 3 centimeters away from the substrate. The nitrogen flow was within the range of 100 to 400 sccm and the silane flow rate varied from 0.2 to 2.2 sccm. RF frequency was 13.56 MHz. The substrate temperature was maintained at 350 degrees Centigrade during film deposition. The bare silicon samples were used to determine deposited nitride thickness, etch rate in dilute (10:1) hydrofluoric acid in water and refractive index. Thickness and refractive index were determined using a commercial ellipsometer. One MOS chip from each lot was then loaded into a nitrogen ambient furnace and ramped to 600 degrees, 800 degrees or 1000 degrees Centigrade at a rate of 40 degrees per minute. The chips were held at the desired temperature for sixty (60) minutes and allowed to cool to room temperature over a three hour period. After reaching room temperature, each chip was examined for evidence of cracking or adhesion loss due to thermal cycling.

Based upon the data set forth in the Table and in FIG. 2, it is evident that the dominant factor pertaining to silicon nitride growth in the absence of ammonia in a plasma enhanced chemical vapor deposition process is the nitrogen to silane gas ratio. Thus, maintaining the ratio at 300:1 or less results in the reduction of film stress to a level which permits one to thermally stress the wafers employed without running the risk of causing mechanical failure of the nitride film. Furthermore, the etch rate using hydrofluoric acid can be controlled to the point where the silicon nitride film is almost impervious to the acid or is capable of being adjusted such that etching is effected at a rate in excess of 1500 Angstroms per minute solely by varying the nitrogen to silane gas ratio. This ability to tailor the film stress and etch rate is critical in the integration of these technologies and finds particular application in the growth of gallium arsenide by heteroepitaxy on silicon CMOS devices.

The described technique is of particular interest in the monolithic integration of interconnected GaAs/AlGaAs double heterostructure modulators and silicon MOSFET structures. In this process, it is necessary to cover the wafer of interest with successive layers of silicon dioxide and a layer of silicon nitride to protect the MOSFET structures during gallium arsenide epitaxy and subsequent processing While the invention has been described in detail in the foregoing specification and in the exemplary embodiment, it will be appreciated by those skilled in the art that many variations may be made without departing from the spirit and scope of the invention.

What is claimed is:

1. Method for the preparation of a silicon nitride gallium diffusion barrier upon a silicon substrate prior to the molecular beam epitaxial growth of gallium arsenide on silicon sub-micron metal oxide semiconductor electronics which comprises the steps of (a) depositing a reflowable glass layer upon a (100) silicon substrate oriented 3 degrees off axis bearing a thin film of silicon dioxide, (b) subjecting the resultant structure to a gaseous mixture comprising nitrogen and silane in a plasma enhanced chemical vapor deposition chamber, the ratio of nitrogen to silane being less than 300:1, thereby forming a silicon nitride layer, and (c) depositing gallium arsenide by molecular beam epitaxial growth on said silicon nitride layer.

2. Method for the preparation of a gallium diffusion barrier comprising silicon nitride upon a (100) silicon substrate oriented 3 degrees off axis containing partially processed electronic devices having a top dielectric layer comprising a reflowable glass which comprises the steps of (a) cleaning the substrate by conventional techniques and depositing a thin film of silicon dioxide upon said to dielectric layer, (b) disposing the cleansed substrate in a glow discharge plasma chamber having an rf-powered source, (c) subjecting the substrate to a gaseous mixture comprising nitrogen and silane wherein the ratio of nitrogen to silane is less than 400:1, the substrate being maintained at a temperature within the range of 250 to 460 degrees Centigrade, so resulting in the deposition of a silicon nitride film on said substrate, and (d) depositing gallium arsenide by molecular beam epitaxial growth on said silicon nitride film.

3. Method in accordance with claim 2 wherein the rf frequency is 13.56 MHz.

4. Method in accordance with claim 2 wherein the nitrogen gas flow is in the range of 100 to 400 sccm and the silane gas flow varies from 0.2 to 2.0 sccm.

5. Method in accordance with claim 2 wherein the substrate temperature is maintained at 350 degrees Centigrade.

6. Method in accordance with claim 2 wherein the nitrogen to silane ratio ranges from 53:1 to 300:1.

7. Method in accordance with claim 2 wherein the substrate was cleansed by immersion in an aqueous solution of sulfuric peroxide followed by a distilled water rinse.

\* \* \* \* \*